(12) United States Patent
Aga et al.

(10) Patent No.: US 9,240,344 B2
(45) Date of Patent: Jan. 19, 2016

(54) METHOD FOR MANUFACTURING SOI WAFER (71) Applicant: SHIN-ETSU HANDOTAI CO., LTD., Tokyo (JP)

(72) Inventors: Hiroji Aga, Takasaki (JP); Norihiro Kobayashi, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/360,545

(22) PCT Filed: Nov. 13, 2012

(86) PCT No.: PCT/JP2012/007267
§ 371 (c)(1),
(2) Date: May 23, 2014

(87) PCT Pub. No.: WO2013/088636
PCT Pub. Date: Jun. 20, 2013

(65) Prior Publication Data
US 2014/0329372 A1    Nov. 6, 2014

(30) Foreign Application Priority Data

Dec. 15, 2011  (JP) ................. 2011-274999

(51) Int. Cl.
*H01L 21/762*    (2006.01)
*H01L 21/02*    (2006.01)
(Continued)

(52) U.S. Cl.
CPC .... *H01L 21/76254* (2013.01); *H01L 21/02112* (2013.01); *H01L 21/02318* (2013.01);
(Continued)

(58) Field of Classification Search
None
See application file for complete search history.

(56) References Cited

U.S. PATENT DOCUMENTS 6,372,609 B1    4/2002   Aga et al.
2003/0181001 A1  9/2003   Aga et al.
(Continued)

FOREIGN PATENT DOCUMENTS

EP    2 175 477 A1    4/2010
EP    2 525 390 A1    11/2012
(Continued)

OTHER PUBLICATIONS

International Search Report issued in International Patent Application No. PCT/JP2012/007267 mailed Feb. 19, 2013.
(Continued)

*Primary Examiner* — Khaja Ahmad
(74) *Attorney, Agent, or Firm* — Oliff PLC (57) ABSTRACT

A method for manufacturing a SOI wafer, including a step of performing a thickness reducing adjustment to a SOI layer of the SOI wafer by carrying out a sacrificial oxidation to the SOI wafer for effecting thermal oxidation to a surface of the SOI layer and removing a formed thermal oxide film, wherein, when the thermal oxidation in the sacrificial oxidation treatment is carried out with the use of a batch processing heat treatment furnace during the rising of a temperature and/or the falling of a temperature, a substantially concentric oxide film thickness distribution is formed on the surface of the SOI layer. The result is a method for manufacturing a SOI wafer that enables manufacturing a SOI wafer that has improved radial film thickness distribution with good productivity by performing the sacrificial oxidation treatment for forming a substantially concentric oxide film and removing the formed thermal oxide film.

20 Claims, 6 Drawing Sheets (51) Int. Cl.
    *H01L 21/3105*     (2006.01)
    *H01L 21/265*      (2006.01)
    *H01L 21/687*      (2006.01)

(52) U.S. Cl.
    CPC ...... *H01L21/26506* (2013.01); *H01L 21/3105* (2013.01); *H01L 21/68764* (2013.01); *H01L 21/68771* (2013.01)

(56) References Cited

U.S. PATENT DOCUMENTS

| | | |
|---|---|---|
| 2005/0208322 A1 | 9/2005 | Barge et al. |
| 2008/0002244 A1 | 1/2008 | Yagita et al. |
| 2009/0166564 A1* | 7/2009 | Moser et al. ............. 250/492.21 |
| 2010/0112781 A1* | 5/2010 | Yokokawa et al. ............ 438/458 |
| 2010/0112824 A1* | 5/2010 | Yokokawa et al. ............ 438/770 |
| 2010/0120223 A1* | 5/2010 | Kobayashi ........ H01L 21/02057 438/458 |

FOREIGN PATENT DOCUMENTS

| | | |
|---|---|---|
| EP | 2 717 294 A1 | 4/2014 |
| JP | A-5-211128 | 8/1993 |
| JP | A-11-307472 | 11/1999 |
| JP | A-2000-124092 | 4/2000 |
| JP | A-2006-324051 | 11/2006 |
| JP | A-2007-242972 | 9/2007 |
| JP | 2008-177311 A | 7/2008 |
| JP | A-2010-129839 | 6/2010 |
| JP | A-2010-161134 | 7/2010 |
| JP | A-2012-248739 | 12/2012 |
| WO | WO 03/009386 A1 | 1/2003 |
| WO | WO 2011/086628 A1 | 7/2011 |
| WO | WO 2012/164822 A1 | 12/2012 |

OTHER PUBLICATIONS

Sang et al., "Ultraprecision finishing technique by numerically controlled sacrificial oxidation", Journal of Crystal Growth, vol. 310, No. 7-9, Apr. 1, 2008, pp. 2173-2177.

Jun. 18, 2015 Search Report issued in European Application No. 12858247.5.

* cited by examiner

METHOD FOR MANUFACTURING SOI WAFER

TECHNICAL FIELD

The present invention relates to a method for manufacturing an SOI wafer, and more particularly to a method for manufacturing an SOI wafer by boning a silicon single crystal wafer having hydrogen ions implanted therein to a base wafer that serves as a support substrate through an oxide film and then delaminating the silicon single crystal wafer.

BACKGROUND ART

In recent years, as a method for manufacturing an SOI wafer, a method for manufacturing an SOI wafer by bonding an ion-implanted bond wafer and then delaminating the same (an ion implantation delamination method: a technology that is also called a smart cut method (a registered trademark)) has newly begun to attract attention. This ion implantation delamination method is a technology for, e.g., forming an oxide film (an insulator film) on at least one of two wafers, implanting gas ions such as hydrogen ions or rare gas ions from an upper surface of one silicon wafer (a bond wafer), forming a micro bubble layer (a sealed layer) in the wafer, then adhering the ion implanted surface to the other silicon wafer (a base wafer) through the oxide film, subsequently applying a heat treatment (a delamination heat treatment) to delaminate one wafer (the bond wafer) into a thin film form with the use of the micro bubble layer as a cleavage surface, and further applying a heat treatment (a bonding heat treatment) to achieve firm bonding, thereby providing an SOI wafer (see Patent Literature 1). According to this method, the cleavage surface (a delamination surface) is an excellent mirror surface, and the SOI wafer having high film thickness uniformity of an SOI layer can be relatively easily obtained.

However, in case of fabricating an SOI wafer based on the ion implantation delamination method, a damage layer formed due to the ion implantation is present on a surface of the SOI wafer after the delamination, and surface roughness is considerable as compared with a mirror surface of a regular product level silicon wafer. Therefore, according to the ion implantation delamination method, it is necessary to remove such a damage layer and the surface roughness.

In the prior art, to remove this damage layer and others, mirror polishing (a stock removal: approximately 100 nm) with a very small stock removal that is called touch polishing is carried out in a final process after the bonding heat treatment.

However, when polishing including a machining element is performed with respect to the SOI layer, since the stock removal of the polishing is not uniform, there occurs a problem that film thickness uniformity of the SOI layer achieved by implantation and delamination of hydrogen ions and others is deteriorated.

As a method for solving such a problem, there has been carried a flattening treatment for performing a high-temperature heat treatment in place of the touch polishing to improve surface roughness.

For example, Patent Literature 2 suggests adding a heat treatment (a rapid heating/rapid cooling heat treatment (an PTA treatment)) in a reducing atmosphere containing hydrogen without polishing a surface of an SOI layer after a delamination heat treatment (or a bonding heat treatment). Further, Patent Literature 3 suggests forming an oxide film on an SOI layer by a heat treatment in an oxidizing atmosphere after the delamination heat treatment (or the bonding heat treatment), then removing the oxide film, and subsequently adding a heat treatment (the rapid heating/rapid cooling heat treatment (the RTA treatment)) in a reducing atmosphere.

Furthermore, in Patent Literature 4, a sacrificial oxidation treatment is performed with respect to a delaminated SOI wafer after a flattening heat treatment in an inert gas, a hydrogen gas, or a mixed gas atmosphere containing these gases, whereby flattening of a cleavage surface and avoidance of OSFs can be achieved at the same time.

As described above, since the high-temperature heat treatment is carried out in place of the touch polishing and the flattening treatment for improving the surface roughness is effected, SOI wafers each having a diameter of 300 mm and excellent film thickness uniformity that a film thickness Range (a value obtained by subtracting a minimum value from a maximum value in a radial direction) of each SOI layer is within 3 nm can be obtained in a high-volume production level by the ion implantation delamination method.

CITATION LIST

Patent Literatures

Patent Literature 1: Japanese Patent Application Publication No. H5-211128
Patent Literature 2: Japanese Patent Application Publication No. H11-307472
Patent Literature 3: Japanese Patent Application Publication No. 2000-1.24092
Patent Literature 4: WO 2003/009386

DISCLOSURE OF INVENTION

Problem to be Solved by the Invention

With the spread of mobile terminals in recent years, a reduction in power consumption, miniaturization, and high functionality of semiconductor devices are required, and a fully depleted device using an SOI wafer has been developed as a major candidate for the 22 nm generation and subsequent generations based on the design rules. In this fully depleted device, since a film thickness of the SOI is as very thin as approximately 10 nm and a film thickness distribution of the SOI affects a threshold voltage of the device, uniformity that the film thickness Range is 1 nm or less (Range (Max−Min) ≤1 nm) has been demanded as a radial film thickness distribution of the SOI. Moreover, in recent years, controlling a threshold voltage of the device by biasing a BOX layer (a buried oxide film layer) that is usually used for insulation relative to a base wafer has been suggested, and a Thin BOX type SOI wafer having a reduced BOX film thickness must be manufactured in this case.

In a method for manufacturing a bonded wafer using the ion implantation delamination method, an ion implantation depth (range) distribution is reflected to a film thickness distribution of an SOI layer after delamination as it is, and a cone angle effect is known for a cause of producing the ion implantation depth distribution.

Figure 5:
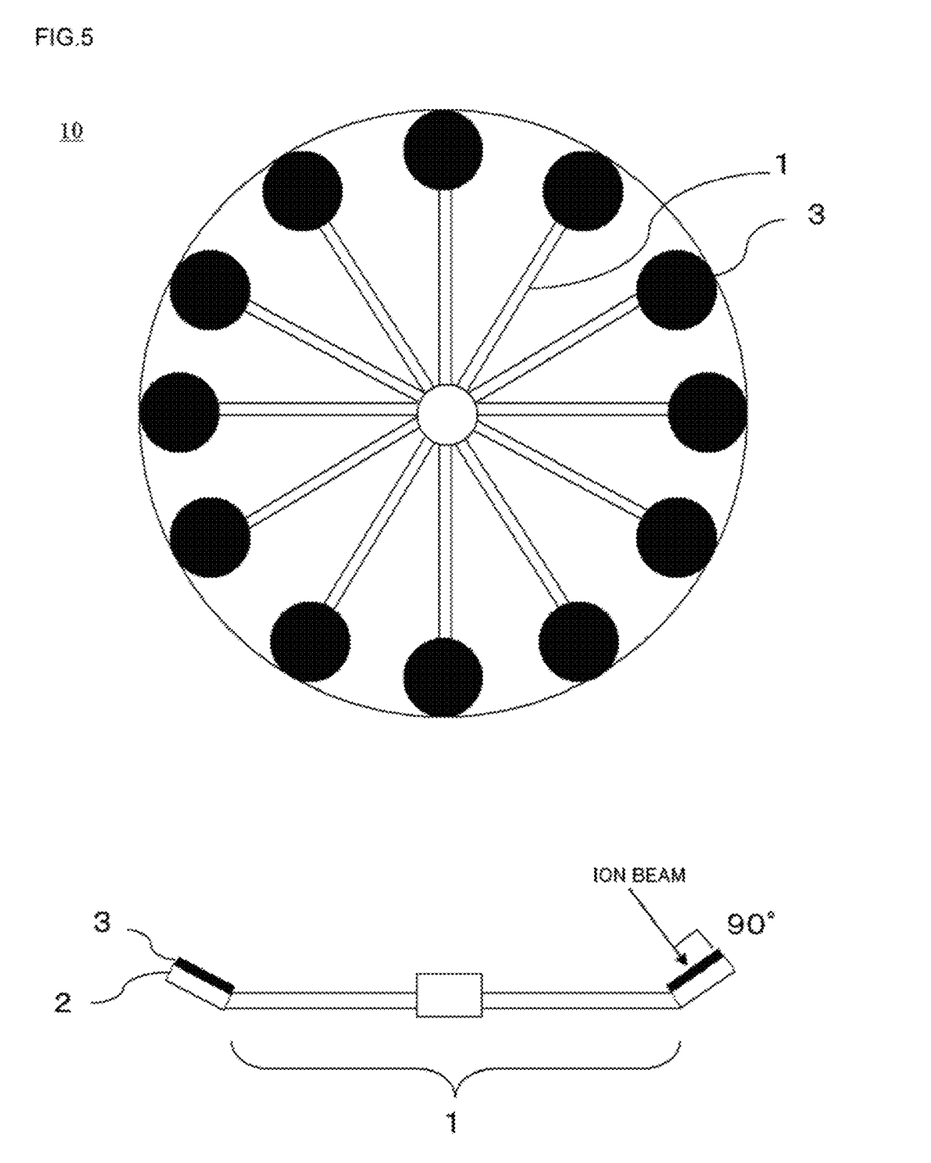
FIG. 5 is a schematic view of a batch processing ion implantation apparatus.

Here, as shown in FIG. 5, a batch processing ion implanter includes a rotor 1 and a plurality of wafer holders 2 which are provided on the rotor 1 and have substrates 3 arranged thereon, respectively. Further, to hold the substrates 3, the wafer holders 2 are slightly inclined toward the inner side from a rotary surface of the rotor 1.

Figure 6:
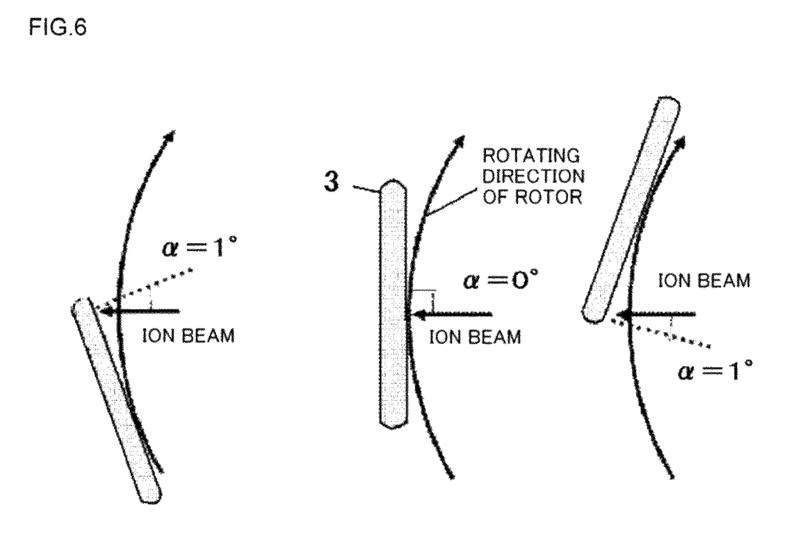
FIG. 6 is an explanatory view for explaining a cone angle effect.

As a result, when the rotor 1 rotates, force that presses the substrates 3 against the wafer holders 2 works by centrifugal force so that the wafer holders 2 can hold the substrates 3, respectively. However, in a case where the rotary surface of the rotor 1 is not parallel to surfaces of the substrates 3, even if implanting an ion beam into each substrate 3 at a fixed angle is tried, a small displacement occurs in an implant angle at a center portion of the substrate and both end portions of the substrate in a beam scan direction in accordance with rotation of the rotor, whereby an ion implantation depth becomes large at the central portion of the substrate and small at both the end portions of the substrate in the scan direction. This is called a cone angle effect. Therefore, in the ion implantation based on the ion implantation delamination method, as shown in FIG. 6, when a setting angle for each substrate 3 and the ion beam is set to an implantation angle 0 degree ($\alpha=0°$) at which an angle between the substrate surface and the ion beam becomes perpendicular, a radial distribution of the implantation depth is adjusted to be relatively uniform in such a manner that the implantation angle equally shifts at both the end portions of the substrate in the scan direction.

However, in a case where the batch processing ion implanter is used, even if the implantation angle is set to 0 degree, a second cause of unevenness in the radial depth distribution of the ion implantation can be considered.

The second cause of generation of a film thickness distribution is that channeling occurs in fabrication of a Thin BOX type SOI wafer. In fabrication of the Thin BOX type SOI wafer having a BOX layer (a silicon oxide film layer) film thickness that is 100 nm or less, a scattering effect provided by an oxide film becomes weak, and channeling occurs in the ion implantation where the implantation angle is set to 0 degree. In case of the batch processing ion implanter, since an angle between a crystal plane and the ion beam becomes perpendicular at the central portion of the substrate, a channeling effect becomes considerable, and an ion implantation depth becomes deeper. On the other hand, since an implantation angle is produced at each of both the ends of the substrate in the scan direction due to a cone angle, the channeling effect becomes relatively weak, and the ion implantation depth becomes shallow. As described above, in the fabrication of the Thin BOX type SOI wafer, the cone angle effect is emphasized by the channeling in particular.

To avoid the channeling, a method for inclining an implantation angle and performing implantation is generally known, but the effect of a cone angle differs depending on each of both ends of the substrate in a scan direction when the implant angle is inclined, and hence the radial depth distribution becomes large. Further, although a method for avoiding the channeling with the use of a wafer in which an orientation of a crystal axis of the wafer itself is inclined (a wafer with an off-angle) is known, since an implant angle differs depending on each of both end portions in a scan direction like the method for inclining the implant angle, and hence a radial depth distribution becomes large.

As a method for suppressing an SOI film thickness distribution provided by the cone angle effect, there is a method for performing divided implantation and changing a direction of a wafer in each ion implantation (a wafer arranged on a wafer holder is rotated on its axis at a predetermined angle) (Japanese Patent Application No. 2011-120340).

The cone angle effect provides a depth distribution produced between a central portion of the wafer and each of both end portions of the wafer in a scan direction, and hence a dyad symmetry distribution is provided. Therefore, for example, when the ion implantation is divided into two and the wafer is rotated (rotated on its axis) 90 degrees in each ion implantation, the central portion of the wafer is relatively deep, an outer peripheral portion of the wafer is shallow on a whole circumference, and hence the distribution is close to a distribution of a concentric circle. Additionally, the ion implantation is not restricted to division into two steps and, if the ion implantation is divided into four steps to be carried out and the wafer is rotated (rotated on its axis) 90 degrees at the time of each ion implantation, the distribution of a concentric circle is further adjusted as compared with the division into two steps.

Since the ion implantation depth distribution obtained by the implantation as described above is relatively deep at the central portion of the wafer but relatively shallow at the whole circumference of the outer periphery of the wafer, an SOI film thickness distribution of an SOI wafer after delamination is a concentric convex film thickness distribution that is thick at the central portion of the wafer but thin at the outer peripheral portion of the wafer. As a method for improving this film thickness distribution, a stock removal of a thermal oxide film obtained by a sacrificial oxidation treatment (thermal oxidation+removal of an oxide film) can be considered. However, in the prior art, a convex shape cannot be obtained by controlling a radial distribution of the thermal oxide film, an oxidation furnace or a specific boat slot position in a treatment batch where a convex oxide film distribution that cancels out a film thickness distribution at the time of wafer delamination is formed must be experimentally found out, selectively used, and subjected to the sacrificial oxidation treatment, and hence productivity has a problem.

In view of the above-described problem, it is an object of the present invention to provide a method for manufacturing an SOI wafer by performing a sacrificial oxidation treatment for forming a thermal oxide film having a substantially concentric film thickness distribution and removing the formed thermal oxide film, thereby manufacturing an SOI wafer having an improved radial film thickness distribution with good productivity.

Means for Solving Problem

To solve the problem, in the present invention, there is provided a method for manufacturing an SOI wafer, the method having a step of performing a thickness reducing adjustment to an SOI layer of the SOI wafer by carrying out a sacrificial oxidation to the SOI wafer for effecting thermal oxidation to a surface of the SOI layer and removing a formed thermal oxide film, wherein, when the thermal oxidation in the sacrificial oxidation treatment is carried out with the use of a batch processing heat treatment furnace during at least either rising of a temperature or falling of a temperature, a substantially concentric oxide film thickness distribution is formed on the surface of the SOI layer.

According to the thermal oxidation based on such a sacrificial oxidation treatment, the thermal oxide film having the substantially concentric oxide film thickness distribution can be formed. Therefore, for example, the radial film thickness distribution of the SOI layer produced due to the ion implantation delamination can be canceled out, and each SOI wafer in which the radial film thickness distribution of a finally obtained SOI layer is dramatically improved can be manufactured in a mass-volume production level.

Further, in this case, it is preferable to carry out the thermal oxidation in the sacrificial oxidation treatment at a predetermined temperature and also perform the same during at least either the rising of a temperature to the predetermined temperature or the falling of a temperature from the predetermined temperature.

As described above, it is preferable to perform the thermal oxidation during the falling of a temperature and/or the thermal oxidation during the rising of a temperature in combination with the oxidation treatment at a predetermined temperature that is carried out based on the conventional sacrificial oxidation. That is, it is preferable to perform the thermal oxidation in one of situations, i.e., 1) during the rising of a temperature to a predetermined temperature+a predetermined temperature+during the falling of a temperature from a predetermined temperature, 2) during the rising of a temperature to a predetermined temperature+a predetermined temperature, and 3) a predetermined temperature+during the falling of a temperature from a predetermined temperature. As a result, a thicker concentric thermal oxide film can be formed.

Further, in this case, as the thermal oxidation in the sacrificial oxidation treatment, a pyrogenic oxidation treatment or a wet oxidation treatment can be used.

As described above, the sacrificial oxidation treatment can be carried out by forming the thermal oxide film based on the pyrogenic oxidation treatment or the wet oxidation treatment and removing the formed thermal oxide film.

Furthermore, in this case, it is preferable to manufacture the SOI wafer that is to be subjected to the sacrificial oxidation treatment by ion-implanting at least one type of gas ions including hydrogen ions and rare gas ions from a surface of a bond wafer made of silicon single crystal to form an ion implanted layer, bonding the ion implanted surface of the bond wafer to a surface of a base wafer through an insulator film, and then delaminating the bond wafer at the ion implanted layer.

The ion implantation depth at the time of the ion implantation is reflected to the film thickness distribution of the SOI layer after the delamination as it is. Therefore, the sacrificial oxidation treatment in the present invention is very effective for the SOI wafer manufactured by the ion implantation delamination method having the cone angle effect or the influence of channeling. In this case, if a heat treatment is added in an inert gas atmosphere at a temperature of approximately 500° C. or more, the bond wafer can be delaminated at the ion implanted layer. Moreover, when a plasma treatment is performed to a bonding surface at an ordinary temperature in advance, external force can be added to effect delamination without adding the heat treatment (or after adding a heat treatment that does not cause the delamination).

Additionally, in this case, it is preferable to divisionally perform the ion implantation in a plurality of steps by using a batch processing ion implanter that comprises a rotor and a plurality of wafer holders which are provided on the rotor and have substrates arranged thereon respectively, and implants ions into the plurality of substrates that are arranged on the wafer holders and revolve, rotate the bond wafer arranged on each wafer holder on its axis a predetermined rotation angle after each ion implantation, and perform subsequent ion implantation at a rotated arrangement position.

When the SOI wafer that is to be subjected to the sacrificial oxidation treatment is manufactured by such a method, the bond wafer can be set on the wafer holder in a direction that differs in accordance with each ion implantation, unevenness in the ion implantation depth distribution can be improved by avoiding the ion implantation at an overlapping arrangement position, and the radial film thickness distribution after the delamination becomes closer to a concentric distribution. Therefore, when the sacrificial oxidation treatment in the present invention is carried out and the oxide film thickness distribution of the thermal oxide film is controlled to be formed into a substantially concentric shape, the SOI film thickness distribution can be easily improved, and the SOI wafer having the film thickness Range further improved relative to a state immediately after the delamination.

Further, in this case, it is preferable to divisionally perform the ion implantation in two steps, rotate the bond wafer on its axis 90 degrees or 180 degrees after the first ion implantation, and carry out the second implantation at a rotated arrangement position.

When the ion implantation is carried out in this manner, unevenness in the ion implantation depth distribution can be reduced, the ion implantation depth distribution is relatively deep at the central portion of the bond wafer but shallow at the whole circumference of the outer peripheral portion of the bond wafer, and the ion implantation depth distribution becomes closer to the concentric distribution. Therefore, the film thickness distribution can be easily corrected by a film reducing adjustment based on the subsequent sacrificial oxidation treatment in the present invention, which is preferable.

Furthermore, in this case, it is preferable to divisionally perform the ion implantation in four steps, carry out second or subsequent ion implantation at an arrangement position obtained by rotating each wafer on its axis any rotation angle selected from 90, 180, and 270 degrees with respect to first ion implantation.

As described above, when the ion implantation is carried out divisionally in four steps, the unevenness can be further reduced as compared with the case where the ion implantation is carried out divisionally in two steps, the ion implantation depth distribution becomes closer to the concentric shape, and hence the film thickness distribution can be further easily corrected by the film reducing adjustment based on the subsequent sacrificial oxidation treatment.

Moreover, in this case, it is preferable for the insulator film to be a silicon oxide film of 100 nm or less.

As described above, even in case of manufacturing the Thin BOX type SOI wafer having the silicon oxide film of 100 nm or less that is hard to provide the excellent film thickness uniformity in the prior art, it is possible to manufacture the thin film SOI wafer having the very excellent film thickness uniformity that the radial film thickness Range is 1 nm or less in the present invention.

Additionally, in this case, it is preferable to set an angle between a crystal plane on a surface of the bond wafer and a direction of the ion implantation to be perpendicular and carry out each ion implantation.

As described above, when the angle between the crystal plane on the surface of the bond wafer and the ion implantation direction is set to be perpendicular, i.e., when the ion implantation angle relative to the crystal plane is set to 0 degree, the unevenness in film thickness distribution of the SOI layer after the delamination can be further suppressed. Therefore, the subsequent film reducing adjustment based on the sacrificial oxidation treatment in the present invention enables further easily correcting the film thickness distribution, which is preferable.

Effect of Invention

As described above, according to the method for manufacturing an SOI wafer of the present invention, the thermal oxide film having the substantially concentric film thickness distribution can be formed in the thermal oxidation of the sacrificial oxidation treatment. Therefore, since the SOI wafer having the dramatically improved film thickness uniformity can be eventually manufactured in the mass-volume production level, a threshold voltage of a device using such an SOI wafer can be stabilized, thereby improving a device yield.

DESCRIPTION OF EMBODIMENTS

As described above, there has been demanded an SOI wafer manufacturing method that enables manufacturing an SOI wafer having an improved radial film thickness distribution with good productivity by performing a sacrificial oxidation treatment that enables forming an oxide film having a substantially concentric film thickness distribution that can cancel out a substantially concentric film thickness distribution (e.g., a convex shape) of an SOI layer in the SOI wafer produced due to ion implantation delamination or the like.

As a result of repeatedly conducting keen examinations and studies on a method for controlling and fabricating a substantially concentric thermal oxide film, the present inventors discovered that a substantially concentric oxide film thickness distribution can be easily formed in a radial direction when an oxidation treatment is carried out during falling of a temperature or rising of a temperature in a batch processing heat treatment furnace.

That is, the present inventors provides an SOI wafer manufacturing method having a step of performing a thickness reducing adjustment to an SOI layer of the SOI wafer by carrying out a sacrificial oxidation treatment to the SOI wafer for effecting thermal oxidation to a surface of the SOI layer and removing a formed thermal oxide film, the method characterized in that the thermal oxidation in the sacrificial oxidation treatment is performed during at least either rising of a temperature or falling of a temperature with the use of a batch processing heat treatment furnace, thereby forming a substantially concentric oxide film thickness distribution on the surface of the SOI layer. The present invention will now be described hereinafter in more detail.

Figure 1:
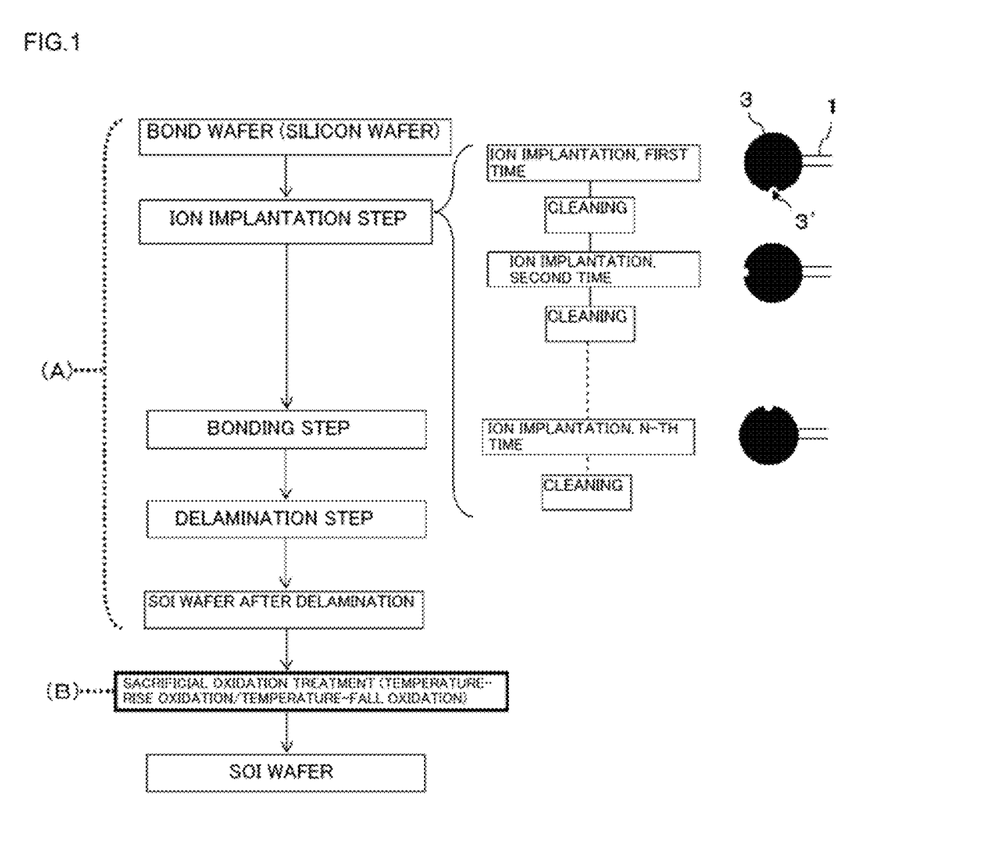
FIG. 1 is a process flowchart showing an example of a method for manufacturing an SOI wafer according to the present invention.

FIG. 1 is a process flowchart showing an example of a method for manufacturing an SOI wafer according to the present invention.

The method for manufacturing an SOI wafer that is to be subjected to the sacrificial oxidation treatment in the present invention is not restricted in particular, and an ion implantation delamination method can be used. FIG. 1 is a process flowchart of the method for manufacturing an SOI wafer according to the present invention when the ion implantation delamination method is used. As shown in FIG. 1(A), at least one type of gas ions including hydrogen ions and rare gas ions is ion-implanted from a surface of a bond wafer made of silicon single crystal, whereby an ion implanted layer is formed (an ion implantation step). It is to be noted that, in the present invention, hydrogen molecular ions are also included in the "hydrogen ions".

Further, it is preferable to form an insulator film on the surface of the bond wafer before the ion implantation in advance. As described above, in manufacture of a Thin BOX type thin film SOI wafer in the prior art, a cone angle effect is emphasized by channeling. As a result of producing the Thin BOX type thin film SOI wafer by way of trial and examining transition of a radial film thickness Range of the SOI within a process, it was found out that the radial film thickness Range already exceeded 1 nm immediately after the delamination. Furthermore, as a result of examining a cause of generation of the radial film thickness Range immediately after the delamination, it was revealed that a radial distribution of an ion implantation depth at the time of the ion implantation greatly affected the film thickness radial Range after the delamination.

However, in the present invention, even if the bond water is a silicon single crystal wafer having a diameter of 300 mm or more that allows the cone angle effect to considerably appear and the insulator film is a silicon oxide film of 100 nm or less or 50 nm or less, the Thin BOX type thin film SOI wafer having excellent film thickness uniformity can be manufactured.

A batch processing ion implanter that is schematically shown in FIG. 5 can be used for the ion implantation. The ion implanter 10 includes a rotor 1 and a plurality of wafer holders 2 which are provided on the rotor and have substrates 3 arranged thereon, respectively, and it is configured to implant ions into the plurality of substrates 3 that are arranged on the wafer holders 2 and revolve.

In the method for manufacturing an SOI wafer according to the present invention, as shown in FIG. 1(A), it is preferable to divisionally carry out the ion implantation of the ion implantation step into each bond wafer 3 in a plurality of steps, rotate each bond wafer 3 arranged on each wafer holder 2 on its axis a predetermined rotation angle after each ion implantation, and perform subsequent ion implantation at a rotated arrangement position. It is to be noted that FIG. 1(A) shows an example of divisionally carrying out the ion implantation n time (n≥2), which is a case where the bond wafer 3 is rotated on its axis 90° (a position of a notch 3' is moved 90°) after the first ion implantation and the second ion implantation is carried out at this rotated arrangement position.

For example, when the ion implantation is divisionally carried out in two steps and the wafer is rotated 90 degrees between the respective ion implantations, an ion implantation depth is relatively deep at a central portion of the bond wafer but shallow at a whole circumference of an outer peripheral portion of the bond wafer, and a uniform distribution is provided and becomes closer to a concentric distribution.

Furthermore, when the ion implantation is divisionally performed in four steps without being restricted to the two steps and the second or subsequent ion implantation is carried out at an arrangement position provided by rotation at a rotation angle that is any one of 90, 180, and 270 degrees with respect to the first ion implantation, the concentric distribution can be further adjusted as compared with the ion implantation performed in the two steps.

When a crystal axis orientation of the bond wafer to be used slightly deviates due to, e.g., an influence of a machining accuracy, even though an implantation angle is set to 0 degree with respect to a wafer surface and implantation is effected, an angle is actually formed between the crystal axis and an ion beam. Therefore, a dyad symmetry distribution in a scan direction gets out of shape, and hence the concentric depth distribution may not be provided by the implantation divisionally performed in the two steps. In this case, when a wafer direction in the ion implantation performed divisionally performed in the two steps is set to 180 degrees, the deviation of the crystal axis can be canceled out, thus obtaining the concentric distribution.

Moreover, when the crystal axis is inclined and a wafer is manufactured, setting an angle that cancels out the deviation of the crystal axis (an off-angle) to an ion beam implantation angle enables suppressing an influence of the deviation of the crystal axis. That is, when an angle between a crystal plane on the surface of the bond wafer and the ion implantation direction is set to be perpendicular (the ion implantation angle relative to the crystal plane is set to 0 degree), unevenness in the film thickness distribution of the thin film after the delamination step can be further suppressed, which is preferable.

Subsequently, as shown in FIG. 1(A), the ion implanted surface of the bond wafer is bonded to a surface of a base wafer through an insulator film (a bonding step).

As the base wafer, a silicon single crystal wafer can be used, but it is not restricted in particular. Usually, the wafers are bonded without using an adhesive or the like when the surfaces of the bond wafer and the base wafer are brought into contact with each other in a clean atmosphere at an ordinary temperature.

Then, as shown in FIG. 1(A), when the bond wafer is delaminated at the ion implanted layer, an SOI wafer having an SOI layer on the base wafer is fabricated (a delamination step).

For example, when a heat treatment is added in an inert gas atmosphere at a temperature of approximately 500° C. or more, the bond wafer can be delaminated at the ion implanted layer. Further, when a plasma treatment is performed with respect to a bonding surface at an ordinary temperature, external force can be applied to effect the delamination without adding the heat treatment (after adding a heat treatment that does not cause the delamination).

The film thickness distribution of such an SOI layer immediately after the delamination step is improved so that the film thickness Range is 1 nm or less, and the film thickness distribution becomes closer to the concentric shape in particular, even in case of the Thin BOX type which has a large diameter of 300 mm or 450 mm and the insulator film of 100 nm or less.

Then, as shown in FIG. 1(B), the SOI wafer after the delamination is subjected to the sacrificial oxidation treatment for performing thermal oxidation to the surface of the SOI layer and removing a formed thermal oxide film, thereby performing a film reducing adjustment with respect to the SOI layer of the SOI wafer.

Here, the present invention is characterized in that the substantially concentric oxide film thickness distribution is formed on the surface of the SOI layer by performing the thermal oxidation in the sacrificial oxidation treatment during at least either rising of a temperature or falling of a temperature with the use of the batch processing heat treatment furnace.

If the thermal oxide film having the substantially concentric oxide film thickness distribution can be formed in this manner, the SOI wafer having the dramatically improved film thickness uniformity can be eventually manufactured in the mass-volume production level.

When the thermal oxidation is carried out, for example, during the falling of a temperature (temperature-fall oxidation) with the use of the batch processing heat treatment furnace, heat can be easily radiated at the outer peripheral portion of the wafer rather than the central portion of the wafer, and a relatively low temperature is achieved. Therefore, when the thermal oxidation is performed during the falling of a temperature, the oxide film thickness distribution of the thermal oxide film has a substantially concentric convex shape. As to a size of the convex shape formed by the temperature-fall oxidation, a difference in oxide film thickness between the central portion and the outer peripheral portion is large as a temperature at the time of temperature-fall oxidation is high, a difference between an initial temperature and a temperature till end of the oxidation is large, a temperature gradient is high, and a size of a gap (a slot interval) with respect to the wafer on an upper surface in a batch is narrow, and appropriately selecting these parameters enables obtaining the substantially concentric convex thermal oxide film having a desired oxide film thickness distribution.

It is to be noted that, as the batch processing heat treatment for obtaining the substantially concentric thermal oxide film distribution, using a vertical heat treatment furnace having a mechanism that rotates the wafer that is in the thermal oxidation process in a direction horizontal to the wafer surface is preferable.

Figure 2:
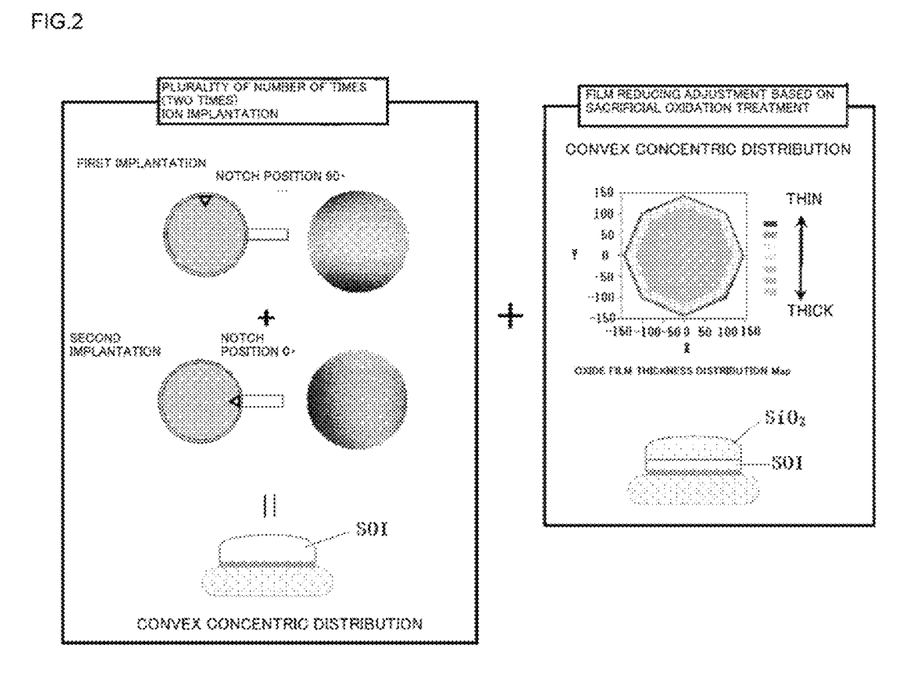
FIG. 2 is an explanatory view of ion implantation delamination in a plurality of step (two steps) and an improvement in film thickness distribution based on a sacrificial oxidation treatment according to the present invention.

As described above, when the ion implantation is divisionally carried out in a plurality of steps in the ion implantation delamination method, the ion implantation depth is relatively deep at the central portion of the bond wafer but shallow at the whole circumference of the outer peripheral portion of the bond wafer, and the uniform distribution is provided and becomes closer to the concentric convex distribution. Therefore, when the SOI wafer that has such a convex film thickness distribution immediately after the delamination is subjected to the thermal oxidation treatment based on the temperature-fall oxidation and the formed thermal oxide film is removed, the SOI film thickness distribution can be controlled and improved. FIG. 2 is an explanatory view of a radial film thickness distribution of the SOI layer when the ion implantation is divisionally performed in two steps and then the sacrificial oxidation treatment based on the temperature-fall oxidation is carried out. Since combining the sacrificial oxidation in the present invention with the ion implantation divisionally performed in a plurality of steps enables canceling out the convex SOI film thickness distribution after the delamination, the SOI wafer having the improved radial film thickness distribution can be manufactured with the excellent productivity.

It is to be noted that, to sufficiently reduce a surface roughness or a surface damage layer of the SOI wafer after the delamination, the sacrificial oxidation treatment may be carried out in combination with a flattening heat treatment (a high-temperature heat treatment in an atmosphere of an inert gas, a hydrogen gas, or a mixed gas of these gases) in some cases.

In the flattening heat treatment, the SOI layer is slightly etched and, at this time, an etching amount is higher at the outer peripheral portion of the wafer than at the central portion of the wafer, and hence the SOI film thickness distribution after the flattening heat treatment tends to be degraded into a convex shape by approximately 0.5 to 2 nm. Therefore, applying the sacrificial oxidation in the present invention can improve the SOI film thickness distribution degraded at the time of the flattening heat treatment.

Moreover, when the oxidation treatment is performed during the rising of a temperature (temperature-rise oxidation) unlike the temperature-fall oxidation, a temperature during the rising of a temperature is relatively higher at the outer peripheral portion close to a heater than at the central portion, and a concave radial distribution of the oxide film thickness to be formed can be obtained. A size of this concave shape can be also controlled by a temperature at the time of the temperature-rise oxidation, a difference between an initial temperature and a temperature till end of the oxidation, a temperature gradient, and a size of a gap (a slot interval) with respect to a wafer on an upper surface in a batch. Therefore, when the radial film thickness distribution of the SOI layer becomes a concave distribution due to, e.g., CMP for sufficiently reducing a surface roughness or a surface damage layer of the SOI wafer after the delamination, the temperature-rise oxidation can be adapted to an improvement in the film thickness distribution of the SOI wafer.

In addition, it is preferable to perform the thermal oxidation in the sacrificial oxidation treatment at a predetermined temperature and also performed during at least either the rising of a temperature to the predetermined temperature or the falling of a temperature from the predetermined temperature.

That is, the temperature-rise or temperature-fall oxidation can be carried out before and after oxidation at a predetermined temperature (e.g., 800° C. to 1000° C.) that is effected as an oxidation treatment, e.g., a conventional sacrificial oxidation, or the temperature-rise oxidation or temperature-fall oxidation treatment alone can be performed as a single treatment. When the thermal oxidation is additionally performed at a predetermined temperature for a predetermined time, a thickness of the oxide film to be formed can be increased, and a temperature and a time can be adjusted in accordance with a necessary stock removal of thickness reduction.

It is to be noted that a temperature raising/temperature falling rate can be set to, e.g., 0.1 to 10° C./min.

Additionally, in regard to combinations of the thermal oxidation at a predetermined temperature and the temperature-rise oxidation/temperature-fall oxidation, (the temperature-rise oxidation to the predetermined temperature)+(the oxidation at the predetermined temperature) or (the oxidation at the predetermined temperature)+(the temperature-fall oxidation from the predetermined temperature) is mainly described above, but the present invention is not restricted thereto. For example, (the temperature-fall oxidation to the predetermined temperature)+(the oxidation at the predetermined temperature) can be performed after once raising a temperature beyond the predetermined temperature, or the temperature-rise oxidation can be carried out while raising a temperature beyond the predetermined temperature (i.e., (the oxidation at the predetermined temperature)+(the temperature-rise oxidation from the predetermined temperature)) after effecting the oxidation at the predetermined temperature.

EXAMPLES

Although the present invention will now be more specifically explained hereinafter based on examples and a comparative example of the present invention, these examples do not restrict the present invention.

Example 1

Figure 3:
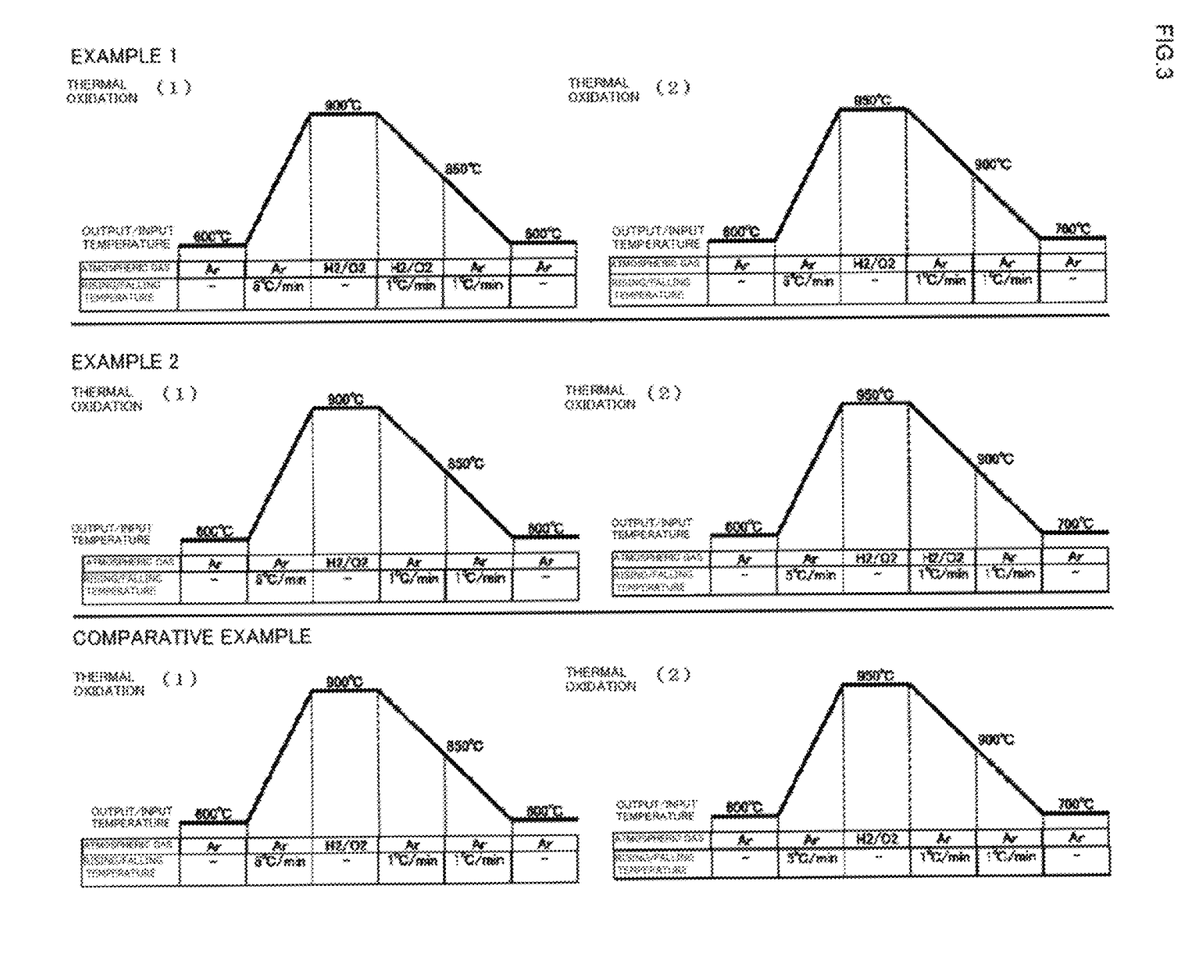
FIG. 3 is a graph showing thermal oxidation conditions in Examples 1 and 2 and Comparative Example.

In Example 1, a buried oxide film that is 25 nm thick was fabricated on a silicon wafer with a diameter of 300 mm made of silicon single crystal having a crystal orientation <100> (a crystal plane on a surface is precisely (100) without an angular deviation), and then hydrogen ion implantation was carried out. The ion implantation was divisionally carried out in two steps with the use of a batch processing ion implanter, first implantation was performed with $H^+$, 30 keV, 2.6 e16 $cm^{-2}$, an implantation angle of 0 degree, and a notch orientation angle of 0 degree, and second implantation was effected with $H^+$, 30 keV, 2.6e16 $cm^{-2}$, an implantation angle of 0 degree, and a notch orientation angle of 90 degrees. After the hydrogen ion implantation, the wafer was bonded to a base wafer and delaminated at a hydrogen ion implanted layer by a nitrogen atmosphere heat treatment performed at 500° C. for 30 minutes. Thereafter, as shown in FIG. 3, a temperature-fall oxidation treatment for continuing a pyrogenic oxidation treatment until 850° C. was performed during the falling of a temperature after the pyrogenic oxidation treatment effected at 900° C. (thermal oxidation (1)). A oxide film thickness after the thermal oxidation was 250 nm. A oxide film thickness distribution was measured by using a PW monitor made of mirror-polished silicon single crystal, an oxide film thickness Range (Max−Min) in a radial direction provided by the temperature-fall oxidation treatment was 1.1 nm, and a concentric distribution that is thick at a central portion and thin at an outer periphery was obtained. Subsequently, a flattening heat treatment was carried out in an Ar atmosphere, and then conventional oxidation at a fixed temperature of 950° C. was performed (thermal oxidation (2)). The radial oxidation film thickness Range after the oxidation treatment was 0.9 nm.

In regard to a film thickness distribution of a 10-nm SOI after removal of a sacrificial oxide film, a radial SOI film thickness distribution Range was 0.7 nm, and the excellent radial distribution was obtained.

Example 2

After the ion implantation delamination was performed like Example 1, as shown in FIG. 3, the conventional oxidation at a fixed temperature of 900° C. was effected (the thermal oxidation (1)). An oxide film thickness after the thermal oxidation was 250 nm. A concentric distribution was out of shape, and a radial oxide film thickness Range of 0.4 nm. Then, the flattening heat treatment was performed in an Ar atmosphere, the temperature-fall oxidation treatment for continuing the pyrogenic oxidation treatment until 900° C. was carried out during the falling of a temperature after the pyrogenic oxidation treatment effected at 950° C. (the thermal oxidation (2)). A oxide film thickness after the thermal oxidation was 440 nm. A oxide film thickness distribution was measured by using a PW monitor, a radial oxide film thickness Range (Max−Min) provided by the temperature-fall oxidation treatment was 1.4 nm, and a concentric distribution that is thick at a central portion and thin at an outer periphery was obtained.

In regard to a film thickness distribution of a 10-nm SOI after removal of a sacrificial oxide film, a radial SOI film thickness distribution Range was 0.8 nm, and the excellent radial distribution was obtained.

Example 3

A thin film SOI wafer having an SOI film thickness of 10 nm was fabricated under the same conditions as those of Example 1 except that the thermal oxidation (2) of Example 1 is the temperature-fall oxidation that is the same as the thermal oxidation (2) in Example 2. In regard to a film thickness distribution of a 10-nm SOI, Range was 0.5 nm, and the very excellent radial distribution was obtained.

Comparative Example

After performing the ion implantation delamination like Example 1, as shown in FIG. 3, conventional oxidation at a fixed temperature of 900° C. was carried out (the thermal oxidation (1)). An oxide film thickness after the thermal oxidation was 250 nm. A concentric distribution was out of shape, and a radial oxide film thickness Range was 0.4 nm. Subsequently, the flattening thermal oxidation was performed in an Ar atmosphere, and then the conventional oxidation at a fixed temperature of 950° C. was conducted (the thermal oxidation (2)), whereby a radial oxide film thickness Range of 0.9 nm.

thermal oxidation (2)) in Examples 1 and 2. It is to be noted that, in Examples 1 to 3 and Comparative Example, a vertical heat treatment furnace having a wafer rotary mechanism was used for the thermal oxidation.

TABLE 1

|  | EXAMPLE 1 | EXAMPLE 2 | COMPARATIVE EXAMPLE |
|---|---|---|---|
| BOND WAFER | DIAMETER 300 mm SILICON WAFER, <100>, SURFACE OXIDE FILM 25 nm | | |
| BASE WAFER | DIAMETER 300 mm SILICON WAFER <100>, WITHOUT SURFACE OXIDE FILM | | |
| DIVISIONAL IMPLANTATION | DIVISIONAL IMPLANTATION IN 2 STEPS | DIVISIONAL IMPLANTATION IN 2 STEPS | DIVISIONAL IMPLANTATION IN 2 STEPS |
| 1ST IMPLANTATION CONDITIONS | H+, 30 keV, 2.6e16 cm$^{-2}$, IMPLANTATION ANGLE 0 DEGREE, NOTCH ORIENTATION ANGLE 0 DEGREES | H+, 30 keV, 2.6e16 cm$^{-2}$, IMPLANTATION ANGLE 0 DEGREE, NOTCH ORIENTATION ANGLE 0 DEGREES | H+, 30 keV, 2.6e16 cm$^{-2}$, IMPLANTATION ANGLE 0 DEGREE, NOTCH ORIENTATION ANGLE 0 DEGREES |
| 2ND IMPLANTATION CONDITIONS | H+, 30 keV, 2.6e16 cm$^{-2}$, IMPLANATION ANGLE 0 DEGREE, NOTCH ORIENTATION ANGLE 90 DEGREES | H+, 30 keV, 2.6e16 cm$^{-2}$, IMPLANTATION ANGLE 0 DEGREE, NOTCH ORIENTATION ANGLE 90 DEGREES | H+, 30 keV, 2.6e16 cm$^{-2}$, IMPLANTATION ANGLE 0 DEGREE, NOTCH ORIENTATION ANGLE 90 DEGREES |
| DELAMINATION HEAT TREATMENT | 500° C., 30 MINUTES, NITROGEN ATMOSPHERE | | |
| SOI FILM THICKNESS IMMEDIATELY AFTER DELAMINATION | 330 nm | 330 nm | 330 nm |
| SOI FILM THICKNESS DISTRIBUTION IMMEDIATELY AFTER DELAMINATION | Range: 0.9 nm | Range: 0.9 nm | Range: 0.9 nm |
| THERMAL OXIDATION (1): SEE FIG. 3 | WITH TEMPERATURE-FALL OXIDATION 900° C. + 900° C.→850° C., 1° C./min FALLING OF TEMPERATURE Slot INTERVAL: 7.5 mm, PYROGENIC OXIDATION, OXIDE FILM THICKNESS: 250 nm | WITHOUT TEMPERATURE-FALL OXIDATION 900° C., Slot INTERVAL: 7.5 mm, PYROGENIC OXIDATION, OXIDE FILM THICKNESS: 250 nm | WITHOUT TEMPERATURE-FALL OXIDATION 900° C., Slot INTERVAL: 7.5 mm, PYROGENIC OXIDATION, OXIDE FILM THICKNESS: 250 nm |
| OXIDE FILM DISTRIBUTION USING PW MONITOR: SEE FIG. 4 | CONCENTRIC CONVEX DISTRIBUTION FILM THICKNESS Range: 1.1 nm | FILM THICKNESS Range: 0.4 nm | FILM THICKNESS Range: 0.4 nm |
| FLATTENING HEAT TREATMENT | Ar, 1200° C., 1 hr | Ar, 1200° C., 1 hr | Ar, 1200° C., 1 hr |
| SOI FILM THICKNESS DISTRIBITION AFTER FLATTENING HEAT TREATMENT | Range: 1.1 nm | Range: 1.4 nm | Range: 1.4 nm |
| THERMAL OXIDATION (2): SEE FIG. 3 | WITHOUT TEMPERATURE-FALL OXIDATION 950° C. Slot INTERVAL 7.5 mm, PYROGENIC, OXIDE FILM THICKNESS: 440 nm | WITH TEMPURATURE-FALL OXIDATION 950° C. + 950° C.→900° C., Slot INTERVAL 7.5 mm, PYROGENIC, OXIDE FILM THICKNESS: 440 nm | WITH TEMPURATURE-FALL OXIDATION 950° C., Slot INTERVAL 7.5 mm, PYROGENIC, OXIDE FILM THICKNESS: 440 nm |
| OXIDE FILM DISTRIBUTION USING PW MONITOR: SEE FIG. 4 | FILM THICKNESS Range: 0.9 nm | CONCENTRIC CONVEX DISTRIBUTION FILM THICKNESS Range: 1.4 nm | FILM THICKNESS Range: 0.9 nm |
| SOI FILM THICKNESS AFTER THINNING | 10 nm | 10 nm | 10 nm |
| SOI FILM THICKNESS DISTRIBUTION AFTER THINNING | Range: 0.7 nm | Range: 0.8 nm | Range: 1.2 nm |

A film thickness distribution of a 10-nm SOI after removal of a sacrificial oxide film was 1.2 nm in terms of Range in Comparative Example.

Figure 4:
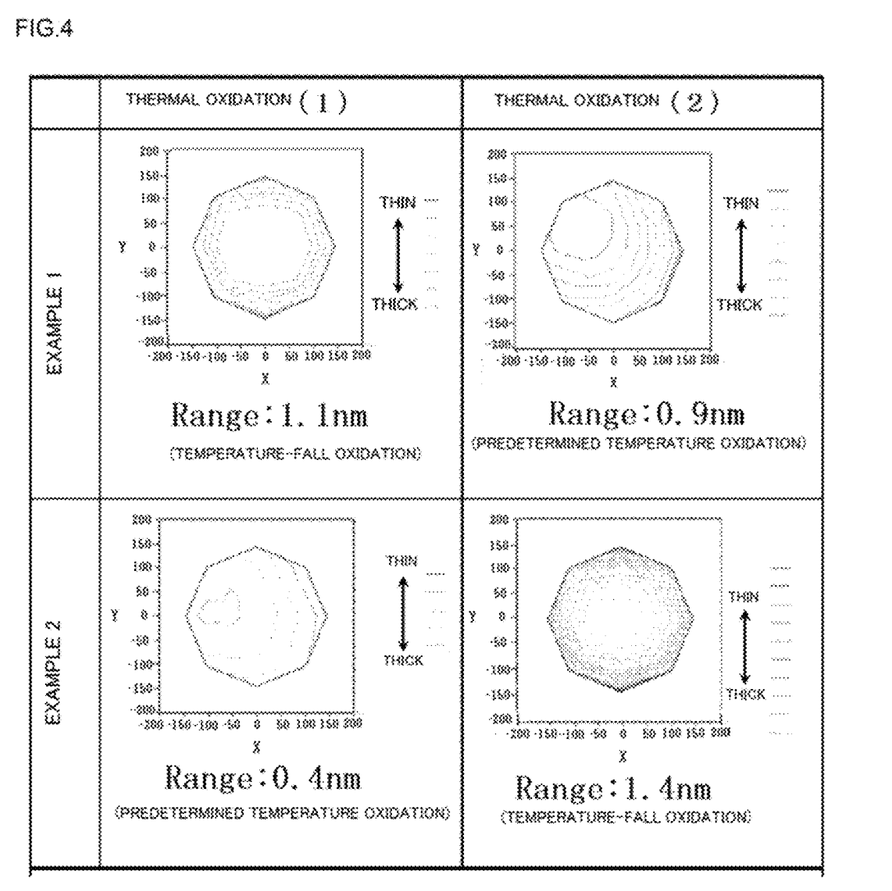
FIG. 4 is a view showing oxide film thickness distributions of thermal oxide films after thermal oxidation (1) and thermal oxidation (2) in Examples 1 and 2, respectively.

Table 1 shows ion implantation delamination conditions, sacrificial oxidation treatment conditions, and results of Examples 1 and 2 and Comparative Example. Further, FIG. 4 shows each oxide film thickness distribution of the PW monitor after the thermal oxidation (the thermal oxidation (1), the thermal oxidation (2)) in Examples 1 and 2.

It can be understood from Table 1 that the radial SOI film thickness distribution is lower than a target value 1 nm in terms of Range in each of Examples 1 and 2 where the temperature-fall oxidation was performed, and the further excellent radial distribution was obtained in Example 3, whereas 1 nm or less as the target value of Range was not obtained in Comparative Example.

It is to be noted that the present invention is not restricted to the foregoing embodiment. The foregoing embodiment is just an illustrative example, and any example that has substantially the same configuration and exercises the same functions and effects as the technical concept described in claims of the present invention is included in the technical scope of the present invention.

The invention claimed is:

1. A method for manufacturing an SOI wafer, having a step of performing a thickness reducing adjustment to an SOI layer of the SOI wafer by carrying out a sacrificial oxidation treatment to the SOI wafer for effecting thermal oxidation to a surface of the SOI layer and removing a formed thermal oxide film formed on the surface of the SOI layer of the SOI wafer,
wherein the SOI layer in the SOI wafer is subjected to the sacrificial oxidation treatment and the SOI layer has a concentric film thickness distribution that is a thickness at the central portion of the SOI layer in the SOI wafer higher than that of an outer peripheral portion of the SOI layer in the SOI wafer or that is a thickness at the central portion of the SOI layer in the SOI wafer being thinner than that of an outer peripheral portion of the SOI layer in the SOI wafer, and
when the thermal oxidation in the sacrificial oxidation treatment is carried out with the use of a batch processing heat treatment furnace during one or both of rising of a temperature or falling of a temperature, the thermal oxide film having a concentric oxide film thickness distribution formed on the surface of the SOI layer so that the concentric film thickness distribution of the SOI layer can be canceled out by the concentric oxide film thickness distribution of the thermal oxide film.

2. The method for manufacturing an SOI wafer according to claim 1,
wherein the thermal oxidation in the sacrificial oxidation treatment is carried out at a predetermined temperature and also performed during one or both of the rising of a temperature to the predetermined temperature and the falling of a temperature from the predetermined temperature.

3. The method for manufacturing an SOI wafer according to claim 1,
wherein, as the thermal oxidation in the sacrificial oxidation treatment, a pyrogenic oxidation treatment or a wet oxidation treatment is used.

4. The method for manufacturing an SOI wafer according to claim 2,
wherein, as the thermal oxidation in the sacrificial oxidation treatment, a pyrogenic oxidation treatment or a wet oxidation treatment is used.

5. The method for manufacturing an SOI wafer according to claim 1,
wherein the SOI wafer that is to be subjected to the sacrificial oxidation treatment is manufactured by ion-implanting at least one type of gas ions including hydrogen ions and rare gas ions from a surface of a bond wafer made of silicon single crystal to form an ion implanted layer, bonding the ion implanted surface of the bond wafer to a surface of a base wafer through an insulator film, and then delaminating the bond wafer at the ion implanted layer.

6. The method for manufacturing an SOI wafer according to claim 2,
wherein the SOI wafer that is to be subjected to the sacrificial oxidation treatment is manufactured by ion-implanting at least one type of gas ions including hydrogen ions and rare gas ions from a surface of a bond wafer made of silicon single crystal to form an ion implanted layer, bonding the ion implanted surface of the bond wafer to a surface of a base wafer through an insulator film, and then delaminating the bond wafer at the ion implanted layer.

7. The method for manufacturing an SOI wafer according to claim 5,
wherein the ion implantation is divisionally performed in a plurality of steps by using a batch processing ion implanter that comprises a rotor and a plurality of wafer holders which are provided on the rotor and have substrates arranged thereon respectively, and implants ions into the plurality of substrates that are arranged on the wafer holders and revolve, the bond wafer arranged on each wafer holder is rotated on its own axis a predetermined rotation angle after each ion implantation, and subsequent ion implantation is performed at a rotated arrangement position.

8. The method for manufacturing an SOI wafer according to claim 6,
wherein the ion implantation is divisionally performed in a plurality of steps by using a batch processing ion implanter that comprises a rotor and a plurality of wafer holders which are provided on the rotor and have substrates arranged thereon respectively, and implants ions into the plurality of substrates that are arranged on the wafer holders and revolve, the bond wafer arranged on each wafer holder is rotated on its own axis a predetermined rotation angle after each ion implantation, and subsequent ion implantation is performed at a rotated arrangement position.

9. The method for manufacturing an SOI wafer according to claim 7,
wherein the ion implantation is divisionally performed in two steps, the bond wafer is rotated on its axis 90 degrees or 180 degrees after the first ion implantation, and the second implantation is carried out at a rotated arrangement position.

10. The method for manufacturing an SOI wafer according to claim 8,
wherein the ion implantation is divisionally performed in two steps, the bond wafer is rotated on its axis 90 degrees or 180 degrees after the first ion implantation, and the second implantation is carried out at a rotated arrangement position.

11. The method for manufacturing an SOI wafer according to claim 7,
wherein the ion implantation is divisionally performed in four steps, second or subsequent ion implantation is carried out at an arrangement position obtained by rotating each wafer on its axis any rotation angles selected from 90, 180, and 270 degrees with respect to first ion implantation.

12. The method for manufacturing an SOI wafer according to claim 8,
wherein the ion implantation is divisionally performed in four steps, second or subsequent ion implantation is carried out at an arrangement position obtained by rotating each wafer on its axis any rotation angles selected from 90, 180, and 270 degrees with respect to first ion implantation.

13. The method for manufacturing an SOI wafer according to claim 5,
wherein the insulator film is a silicon oxide film of 100 nm or less.

14. The method for manufacturing an SOI wafer according to claim 7,
wherein the insulator film is a silicon oxide film of 100 nm or less.

15. The method for manufacturing an SOI wafer according to claim 9,
wherein the insulator film is a silicon oxide film of 100 nm or less.

16. The method for manufacturing an SOI wafer according to claim 11,
wherein the insulator film is a silicon oxide film of 100 nm or less.

17. The method for manufacturing an SOI wafer according to claim 7,
wherein an angle between a crystal plane on a surface of the bond wafer and a direction of the ion implantation is set to be perpendicular, and each ion implantation is carried out.

18. The method for manufacturing an SOI wafer according to claim 9,
wherein an angle between a crystal plane on a surface of the bond wafer and a direction of the ion implantation is set to be perpendicular, and each ion implantation is carried out.

19. The method for manufacturing an SOI wafer according to claim 11,
wherein an angle between a crystal plane on a surface of the bond wafer and a direction of the ion implantation is set to be perpendicular, and each ion implantation is carried out.

20. The method for manufacturing an SOI wafer according to claim 13,
wherein an angle between a crystal plane on a surface of the bond wafer and a direction of the ion implantation is set to be perpendicular, and each ion implantation is carried out.

* * * * *